(12) United States Patent
Kim et al.

(10) Patent No.: US 9,077,287 B2
(45) Date of Patent: Jul. 7, 2015

(54) SOUND DETECTING CIRCUIT AND AMPLIFIER CIRCUIT THEREOF

(75) Inventors: Yi-Gyeong Kim, Daejeon (KR); Min-Hyung Cho, Daejeon (KR); Tae Moon Roh, Daejeon (KR); Jong-Kee Kwon, Daejeon (KR); Woo Seok Yang, Daejeon (KR); Jongdae Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 380 days.

(21) Appl. No.: 13/531,437

(22) Filed: Jun. 22, 2012

(65) Prior Publication Data

US 2013/0099868 A1 Apr. 25, 2013

(30) Foreign Application Priority Data

Oct. 24, 2011 (KR) ........................ 10-2011-0108709

(51) Int. Cl.
*H03F 99/00* (2009.01)
*H03F 3/08* (2006.01)

(52) U.S. Cl.
CPC ....................................... *H03F 3/08* (2013.01)

(58) Field of Classification Search
CPC ..... H03G 1/04; H03G 1/0005; H03G 1/0029; H03G 1/0011; H03G 1/0017; H03G 1/0023; H03G 1/0035; H03G 1/0041; H03G 1/0047; H03G 1/0052; H03G 1/0058; H03G 1/0064; H03G 1/007; H03G 1/076; H03G 1/0082; H03G 1/0088; H03G 1/0094; H03F 21/00; H03F 3/45; H03F 3/16; H03F 3/183; H03F 3/185; H03F 3/187; H03F 3/3037; H03F 3/3042; H03F 3/3088; H03F 3/3089; H04R 3/02; H04R 3/10
USPC .......... 381/23.1, 26, 28, 57, 61, 321, 323, 74, 381/73.1, 83, 86, 91, 92, 93, 94.1, 94.7, 381/94.8, 95, 120, 121, 122, 111, 113; 330/257, 288, 296, 297, 261, 267, 270, 330/273, 285, 290, 96, 123, 130, 131, 134, 330/135, 136, 137; 700/94
See application file for complete search history.

(56) References Cited

U.S. PATENT DOCUMENTS

| 6,842,525 | B1 * | 1/2005 | Mellot .............................. 381/92 |
| 7,634,096 | B2 | 12/2009 | Fallesen |
| 7,756,279 | B2 | 7/2010 | Deruginsky et al. |
| 2007/0076904 | A1 * | 4/2007 | Deruginsky et al. ............ 381/95 |
| 2008/0002841 | A1 * | 1/2008 | Baker et al. .................... 381/113 |
| 2008/0025531 | A1 | 1/2008 | Suzuki et al. |

FOREIGN PATENT DOCUMENTS

| JP | 2007-201698 A | 8/2007 |
| JP | 4422066 B2 | 11/2009 |

* cited by examiner

*Primary Examiner* — Leshui Zhang

(57) ABSTRACT

Disclosed is a sound detecting circuit which includes a sensing unit configured to generate an AC signal in response to a sound pressure level of a sound signal; an amplification unit configured to amplify the AC signal; and a bias voltage generating unit configured to generate a bias voltage to be provided to the amplification unit. The bias voltage generating unit comprises a current source configured to provide a power current; and a current-voltage converting circuit configured to convert the power current into the bias voltage and to reduce a noise due to the power current.

9 Claims, 9 Drawing Sheets

SOUND DETECTING CIRCUIT AND AMPLIFIER CIRCUIT THEREOF

CROSS-REFERENCE TO RELATED APPLICATIONS

A claim for priority under 35 U.S.C. §119 is made to Korean Patent Application No. 10-2011-0108709 filed Oct. 24, 2011, in the Korean Intellectual Property Office, the entire contents of which are hereby incorporated by reference.

BACKGROUND

The inventive concepts described herein relate to a sound detecting circuit, and more particularly, relate to an amplifier circuit for a sound detecting circuit.

A sound detecting circuit may be used to detect a sound pressure level of a sound signal. The sound detecting circuit may include a capacitor-type microphone. The sound detecting circuit may be installed at various electronic devices such as a cellular phone, a notebook computer, a smart phone, a tablet PC, and the like to recognize a voice of a user.

As an electronic device having the microphone becomes small-sized, the microphone may also become small-sized. The less capacitance of the capacitor-type microphone, the lower the sensitivity. Thus, an amplifier circuit to amplify a detected sound signal may be required. In this case, since a noise of the detected sound signal affects the performance of the microphone, there may increase demand for an amplifier circuit that is suitable for miniaturization and is capable of removing a noise of the detected sound signal.

SUMMARY

Example embodiments of the inventive concept provide a sound detecting circuit which comprises a sensing unit configured to generate an AC signal in response to a sound pressure level of a sound signal; an amplification unit configured to amplify the AC signal; and a bias voltage generating unit configured to generate a bias voltage to be provided to the amplification unit. The bias voltage generating unit comprises a current source configured to provide a power current; and a current-voltage converting circuit configured to convert the power current into the bias voltage and to reduce a noise due to the power current.

In example embodiments, a voltage variation of the current-voltage converting circuit is less in amount than a current variation.

In example embodiments, the bias voltage is provided as a reference potential of the AC signal.

In example embodiments, the bias voltage generating unit further comprises a resistance circuit connected to an output stage of the sensing unit and the current-voltage converting circuit.

In example embodiments, the sensing unit comprises a capacitor-type sensor, and the resistance circuit and the capacitor-type sensor constitute an RC filter.

In example embodiments, the resistance circuit is formed of one of a back-to-back diode, a back-to-back diode-connected PMOS transistor, and a back-to-back diode-connected BJT transistor.

In example embodiments, the amplification circuit comprises a PMOS transistor, and the AC signal and the bias voltage are provided to a gate of the PMOS transistor.

In example embodiments, the amplification unit comprises an operational amplifier, and the sensing unit and the bias voltage generating unit are connected to a non-inverting input terminal of the operational amplifier.

In example embodiments, the amplification unit comprises an operational amplifier, the sensing unit is connected to an inverting input terminal of the operational amplifier, and the bias voltage generating unit is connected to a non-inverting input terminal of the operational amplifier.

In example embodiments, the bias voltage generating unit comprises a resistance circuit connected to the non-inverting input terminal of the operational amplifier and the current-voltage converting circuit; and a capacitor connected to the resistance circuit, the resistance circuit and the capacitor constituting an RC filter.

In example embodiments, the current-voltage converting circuit is formed of one of a diode element, a diode-connected BJT transistor element, and a diode-connected MOS transistor.

Example embodiments of the inventive concept provide an amplification circuit which comprises an amplification unit configured to amplify an AC signal sensed by a capacitor-type sensor; and a bias voltage generating unit configured to generate a DC voltage to be provided to the amplification unit. The bias voltage generating unit comprises a current source configured to generate a DC current; and a current-voltage converting circuit configured to convert the DC current into a DC voltage, the DC voltage being provided as a reference potential.

In example embodiments the bias voltage generating circuit comprises a resistance circuit connected to the current-voltage converting circuit and the capacitor-type sensor, and the capacitor-type sensor and the resistance circuit constituting an RC filter.

In example embodiments the RC filter removes a noise generated by the current source and a noise generated by the current-voltage converting circuit.

In example embodiments the current-voltage converting circuit removes a noise generated by the current source, and a voltage variation of the current-voltage converting circuit is less in amount than a current variation.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
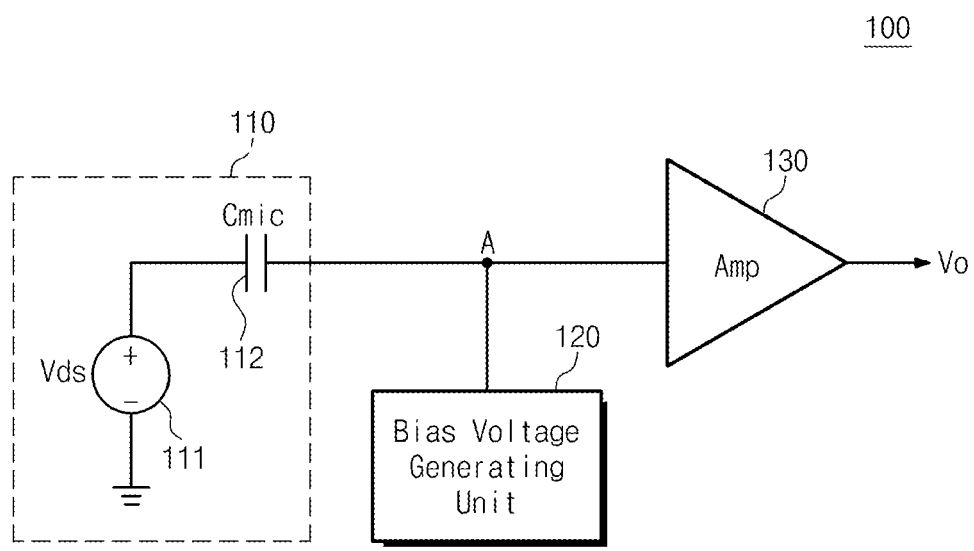
FIG. 1 is a block diagram schematically illustrating a sound detecting circuit according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a sound detecting circuit according to an embodiment of the inventive concept. In FIG. 1, there is illustrated a capacitor-type microphone as a sound detecting circuit. Referring to FIG. 1, a sound detecting circuit 100 may include a sensing unit 110, a bias voltage generating unit 120, and an amplification unit 130.

The sensing unit 110 may be configured to vary a voltage of a node A in response to a sound pressure level of a sound signal. The sensing unit 110 may include a voltage source 111 and a microphone sensor 112.

The microphone sensor 112 may be formed of an electrode layer. A gap of the electrode layer may vary according to a sound pressure level. That is, the microphone sensor 112 may have a characteristic similar to a variable capacitance element the capacitance of which is varied according to a sound pressure level. When a sound pressure level varies under the condition that a sensor bias voltage Vbs is applied to the microphone sensor 112, a voltage of the node A may vary according to the following equation.

$$Q = C_{min} \times V \quad (1)$$

In the equation 1, Q may indicate the amount of charges stored at the microphone sensor 112, Cmin may indicate capacitance of the microphone sensor 112, and V may indicate a voltage across the microphone sensor 112. A voltage of the node A varied according to a variation in a sound pressure level of a sound signal may have the same waveform as an AC signal. Thus, a voltage of the node A varied according to a variation in a sound pressure level may be referred to as an AC signal.

The amplification unit 130 may be connected to the sensing unit 110 through the node A. The amplification unit 130 may amplify the AC signal of the node A to output it as an analog signal Vo.

The bias voltage generating unit 120 may generate a bias voltage to provide it to the amplification unit 130. A voltage generated by the bias voltage generating unit 120 may be provided to the amplification unit 130 through the node A. In this case, a bias voltage may be provided as a reference potential of the AC signal. That is, the bias voltage may enable the amplification unit 130 to have a wide signal processing range by increasing a reference potential level of the AC signal. The amplification unit 130 and the bias voltage generating unit 120 may be used to amplify the AC signal. For this reason, the amplification unit 130 and the bias voltage generating unit 120 may be referred to as an amplification circuit of the sound detecting circuit 100.

Since the bias voltage generating unit 120 is located at an input stage of the amplification unit 130, it may have an excellent noise characteristic. Below, example embodiments of the bias voltage generating unit 120 with an excellent noise characteristic will be more fully described.

In example embodiments, the bias voltage generating unit 120 may be formed of a resistance circuit and a source follower. This will be more fully described with reference to FIG. 2. In other example embodiments, the bias voltage generating unit 120 may be formed of a resistance circuit, a current source, and a current-voltage converting circuit. This will be more fully described with reference to FIGS. 3 to 15.

Figure 2:
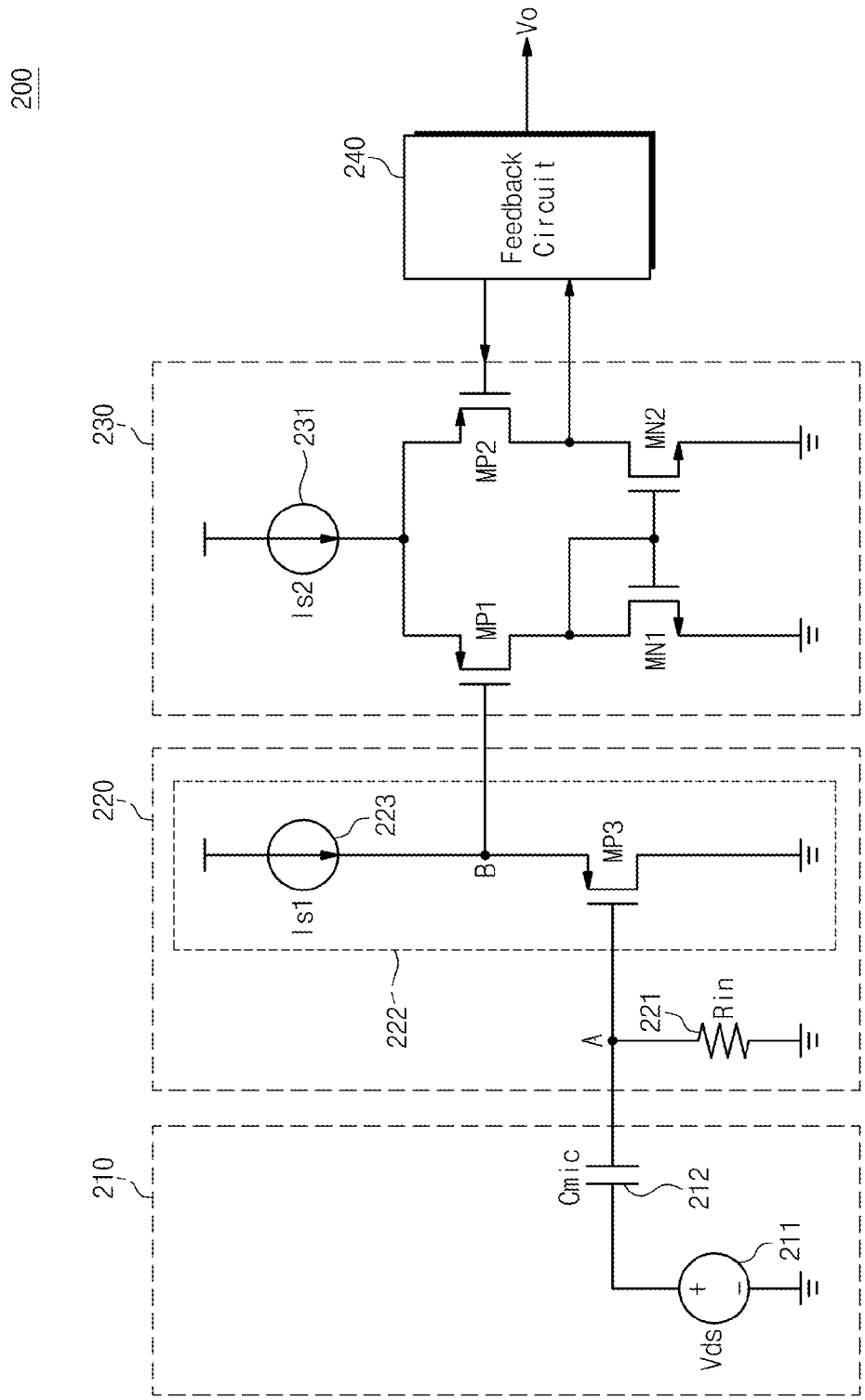
FIG. 2 is a circuit diagram schematically illustrating a sound detecting circuit 200 according to an embodiment of the inventive concept.

FIG. 2 is a circuit diagram schematically illustrating a sound detecting circuit 200 according to an embodiment of the inventive concept. In FIG. 2, there is illustrated a bias voltage generating unit 220 including a resistance circuit 221 and a source follower 222. A sound detecting circuit 200 in FIG. 2 may be similar to that in FIG. 1. Thus, in FIG. 2, constituent elements that are similar to those in FIG. 1 may be marked by similar reference numerals.

Referring to FIG. 2, the sound detecting circuit 200 may include a sensing unit 210, a bias voltage generating unit 220, an amplification unit 230, and a feedback circuit 240.

The sensing unit 210 may include a voltage source 211 and a microphone sensor 212. The sensing unit 210 may vary a voltage of a node A in response to a sound pressure level of a sound signal. That is, the sensing unit 210 may generate an AC signal in response to a sound pressure level of a sound signal.

The bias voltage generating unit 220 may include a resistance circuit 221 and a source follower 222. The resistance circuit 221 may be connected in series to the microphone 221 via the node A. The resistance circuit 221 may be used to define a DC voltage of an output terminal of the microphone sensor 212: the node A. The resistance circuit 221 may be formed of an element having a large resistance value to secure an audio signal band. For example, a resistance value Rin of the resistance circuit 221 may be designed to have Giga ($10^9$) ohms.

The source follower 222 may include a current source 223 and a transistor MP3. The source follower 222 may transfer the AC signal of the node A into a node B. Also, the source follower 222 may amplify a DC voltage of the node A to transfer it to the node B. In this case, the DC voltage of the node B higher than that of the node A may be used to expand a signal processing range of the amplification unit 230.

The amplification unit 230 may amplify the AC signal and the DC signal transferred through the node B. An input stage of the amplification unit 230 may be realized using a PMOS transistor to reduce influence due to a flicker noise. The amplification unit 230 may be formed of a current source 231, PMOS transistor MP1 and MP2, and NMOS transistors MN1 and MN2 which are connected as illustrated in FIG. 2.

A bias voltage higher in level than a predetermined voltage may be provided to the amplification unit 230 such that the amplification unit 230 has a wide signal processing range. That is, a DC voltage provided to the amplification unit 230 must be increased by the source follower 222. If the node A is directly connected to the PMOS transistor P1 without the source follower 222, a signal processing range of the amplification unit 230 may become narrow. Thus, a DC voltage higher in level than a DC voltage of the node A must be provided to an input stage (i.e., the node B) of the amplification unit 230. In this case, the DC voltage of the node B may be referred to as a bias voltage.

The feedback circuit 240 may be connected to the amplification unit 230. The feedback circuit 240 may be used to set a gain and compensate for the stability using a feedback operation. The feedback circuit 240 may output an analog output signal Vo.

As described with reference to FIG. 2, the sound detecting circuit 200 may increase a voltage of the node A using the source follower 222 to provide the amplification unit 230 with a bias voltage higher in level than a predetermined voltage. In this case, the source follower 222 may be located at an input stage of the amplification unit 230. Thus, the performance of the sound detecting circuit 200 may be affected by a noise due to the source follower 222.

To minimize influence due to a noise, the source follower 222 may be formed of elements having an excellent noise characteristic. For example, a transistor MP3 of the source follower 222 may be designed to have an excellent noise characteristic instead of large size and current consumption. Also, the current source 223 of the source follower 222 may be designed to have an excellent noise characteristic instead of a large size. In this case, a size of the sound detecting circuit 200 may become larger.

Sound detecting circuits according to other embodiments of the inventive concept may be configured to have an excellent noise characteristic and to be capable of being formed in a small size, which will be more fully described below.

Figure 3:
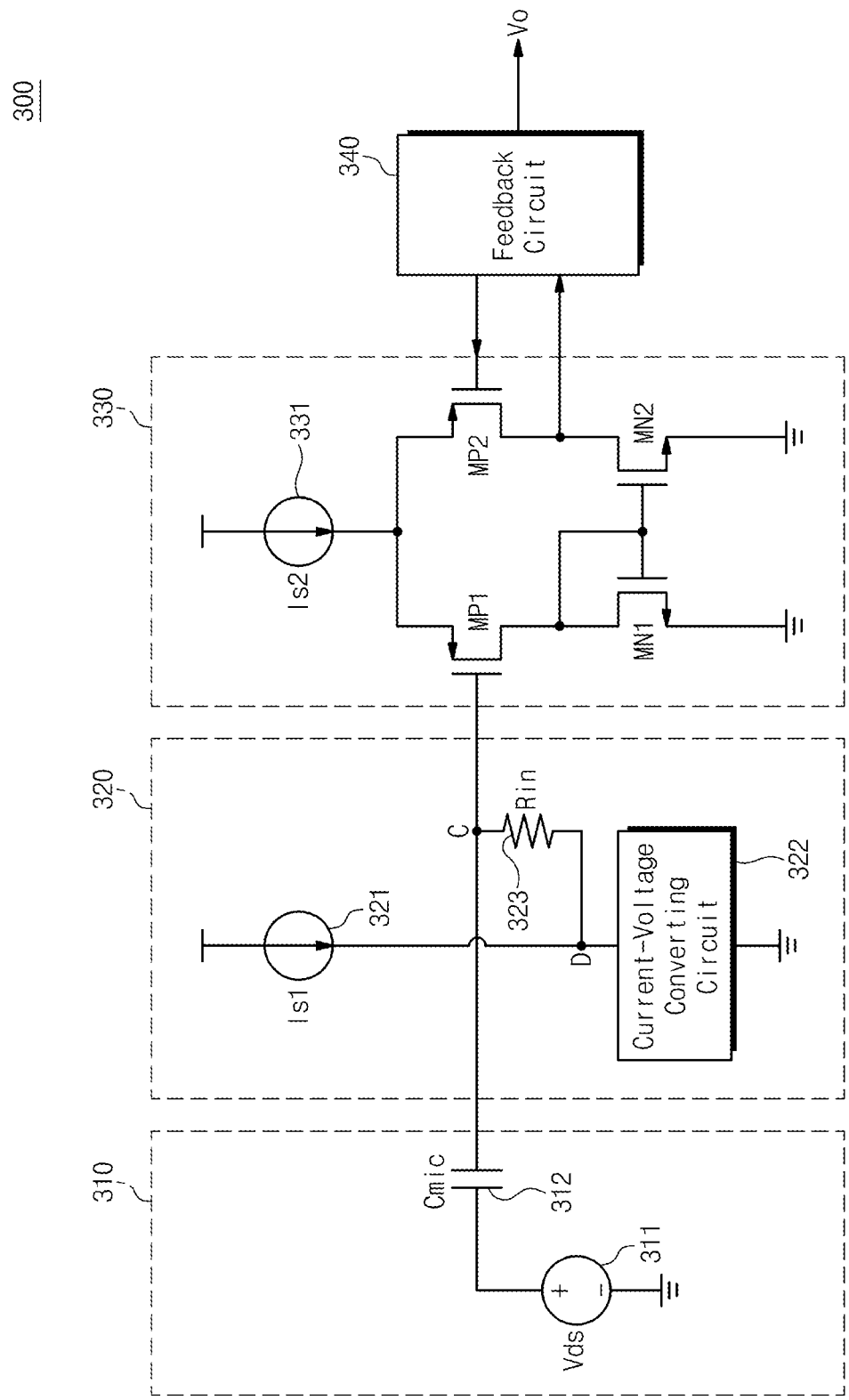
FIG. 3 is a circuit diagram schematically illustrating a sound detecting circuit according to another embodiment of the inventive concept.

FIG. 3 is a circuit diagram schematically illustrating a sound detecting circuit according to another embodiment of the inventive concept. A sound detecting circuit 300 in FIG. 3 may be similar to that in FIG. 2 except for a bias voltage generating unit 320. Thus, constituent elements that are similar to those in FIG. 2 may be marked by similar reference numerals. A difference between the sound detecting circuits in FIGS. 2 and 3 may be mainly described.

Referring to FIG. 3, the sound detecting circuit 300 may include a sensing unit 310, a bias voltage generating unit 320, an amplification unit 330, and a feedback circuit 340. The sensing unit 310 may generate an AC signal on a node C in response to a sound pressure level of a sound signal. The amplification unit 330 may amplify the AC signal to output it through the feedback circuit 340.

Unlike a bias voltage generating unit 220 in FIG. 2, the bias voltage generating unit 320 may not include a source follower. Nevertheless, the bias voltage generating unit 320 may provide the amplification unit 330 with a bias voltage having an excellent noise characteristic and higher in level than a predetermined voltage. The bias voltage generating unit 320 may include a current source 321, a current-voltage converting circuit 322, and a resistance circuit 323. The current source 321 may supply a constant DC current Is1. The DC current Is1 may be provided to the current-voltage converting circuit 322 through a node D.

The current-voltage converting circuit 322 may convert the DC current from the current source 321 into a DC voltage. The current-voltage converting circuit 322 may have a low impedance characteristic. That is, the current-voltage converting circuit 322 may have such a characteristic that a voltage is slightly varied when a current is varied.

Figure 4:
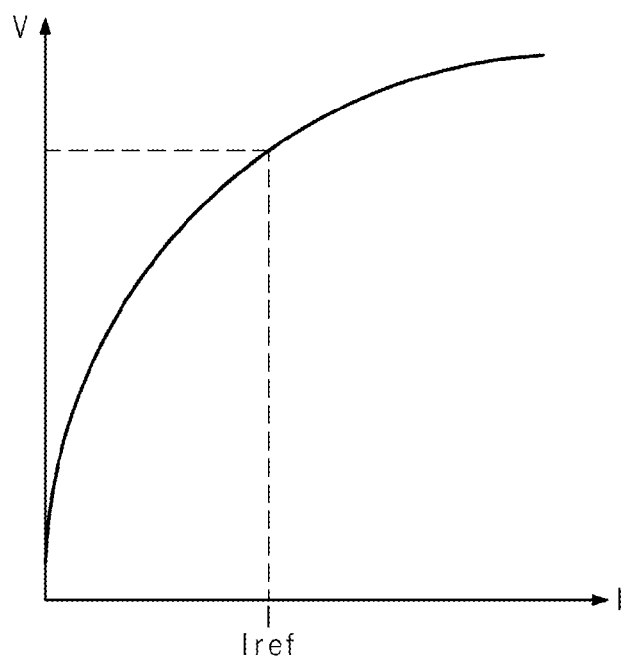
FIG. 4 is a diagram illustrating an operation of a current-voltage converting circuit in FIG. 3.
Figure 5:
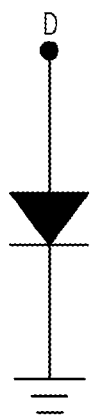
FIGS. 5 to 9 are diagrams a current-voltage converting circuit in FIG. 3 according to example embodiments of the inventive concept.
Figure 6:
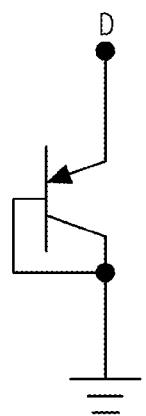
Figure 7:
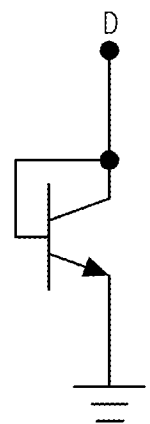
Figure 8:
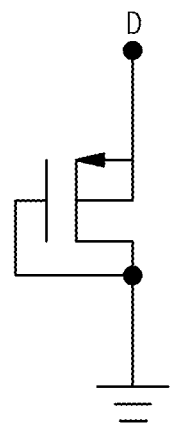
Figure 9:
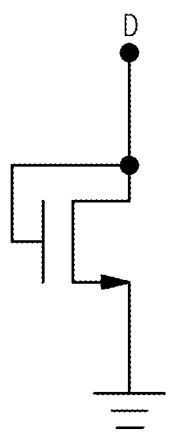
Figure 10:
FIGS. 10 to 14 are diagrams illustrating a resistance circuit in FIG. 3 according to example embodiments of the inventive concept.
Figure 11:
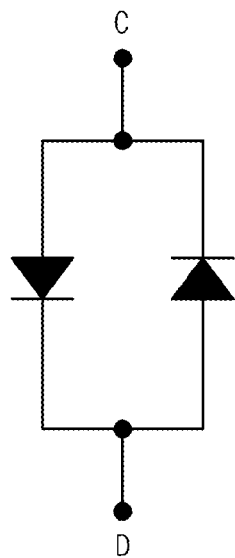
Figure 12:
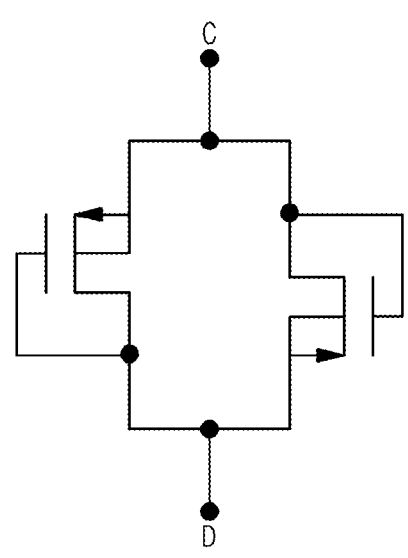
Figure 13:
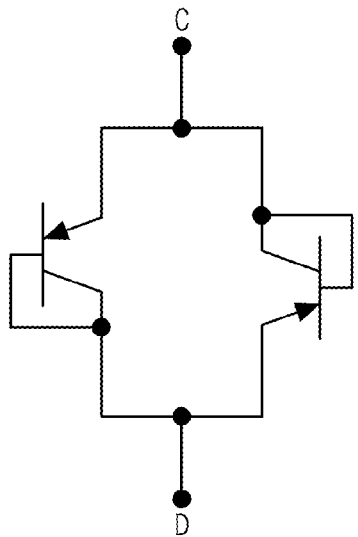
Figure 14:
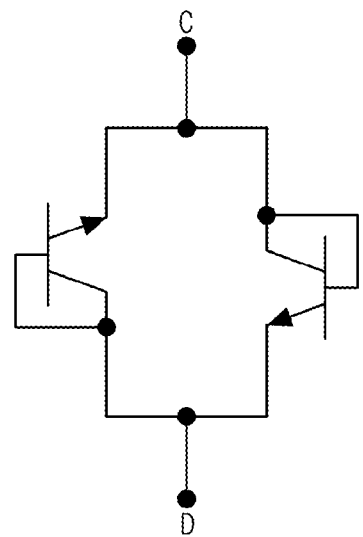

For example, the current-voltage converting circuit 322 may have a current-voltage conversion curve illustrated in FIG. 4. In this case, if a level of a DC current Is1 from the current source 321 is higher than a level of a predetermined current Iref, a voltage may be varied little when a current is varied. Thus, the node D connected with the current-voltage converting circuit 322 may be maintained with a constant voltage. In other words, although the current source 321 is formed of an element the noise characteristic of which is not excellent, a voltage of the node D may be maintained with a constant voltage.

One end of the resistance circuit 323 may be connected with one end (i.e., the node D) of the current-voltage converting circuit 322, and the other end thereof may be connected with an output stage (i.e., the node C) of a microphone sensor 312. A resistance level Rin of the resistance circuit 323 may have Giga ohms to secure an audio signal band as described in FIG. 2. That is, the resistance circuit 323 may have a high impedance characteristic.

Since the nodes C and D are serially connected through the resistance circuit 323, a DC voltage of the node C may be increased by a DC voltage of the node D. Also, since the DC voltage of the node D is stably maintained by a low impedance characteristic, the DC voltage of the node C may be stably maintained.

Since the resistance circuit 323 and the microphone sensor 312 are connected in series, they may act as an RC filter. In this case, since the RC filter formed of the resistance circuit 323 and the microphone sensor 312 is located at an input stage (i.e., the node C) of the amplification unit 330, it may perform a role of removing a noise of a signal to be provided to the amplification unit 330. For example, the RC filter formed of the resistance circuit 323 and the microphone sensor 312 may do a role of removing a noise of the current source 321 and a noise of the current-voltage converting circuit 322. Thus, the DC voltage of the node C may be maintained with a constant level.

Accordingly, a stable bias voltage higher by a predetermined voltage level than a voltage of a node A in FIG. 2 may be provided to an input stage (i.e., the node C) of the amplification unit 330.

As described with reference to FIG. 3, the bias voltage generating unit 320 may generate a bias voltage that is relatively stable and has a high voltage level. The bias voltage generated by the bias voltage generating unit 320 in FIG. 3 may be provided as a reference potential with reference to an AC voltage, and may enable the bias voltage generating unit 320 in FIG. 3 to have a wide signal processing range. Also, since the bias voltage generating unit 320 in FIG. 3 does not include a source follower, it may be formed in a small size.

The current-voltage converting circuit 322 and the resistance circuit 323 in FIG. 3 may be formed variously. For example, as illustrated in FIGS. 5 to 9, the current-voltage converting circuit 322 may be formed of a diode, a diode-connected BJT transistor (an NPN transistor and/or a PNP transistor), a diode-connected MOS transistor (an NMOS transistor and/or a PMOS transistor), and the like. As illustrated in FIGS. 10 to 14, the resistance circuit 323 may be formed of a back-to-back diode, a back-to-back diode-connected PMOS transistor, a back-to-back diode-connected BJT transistor, and the like.

Figure 15:
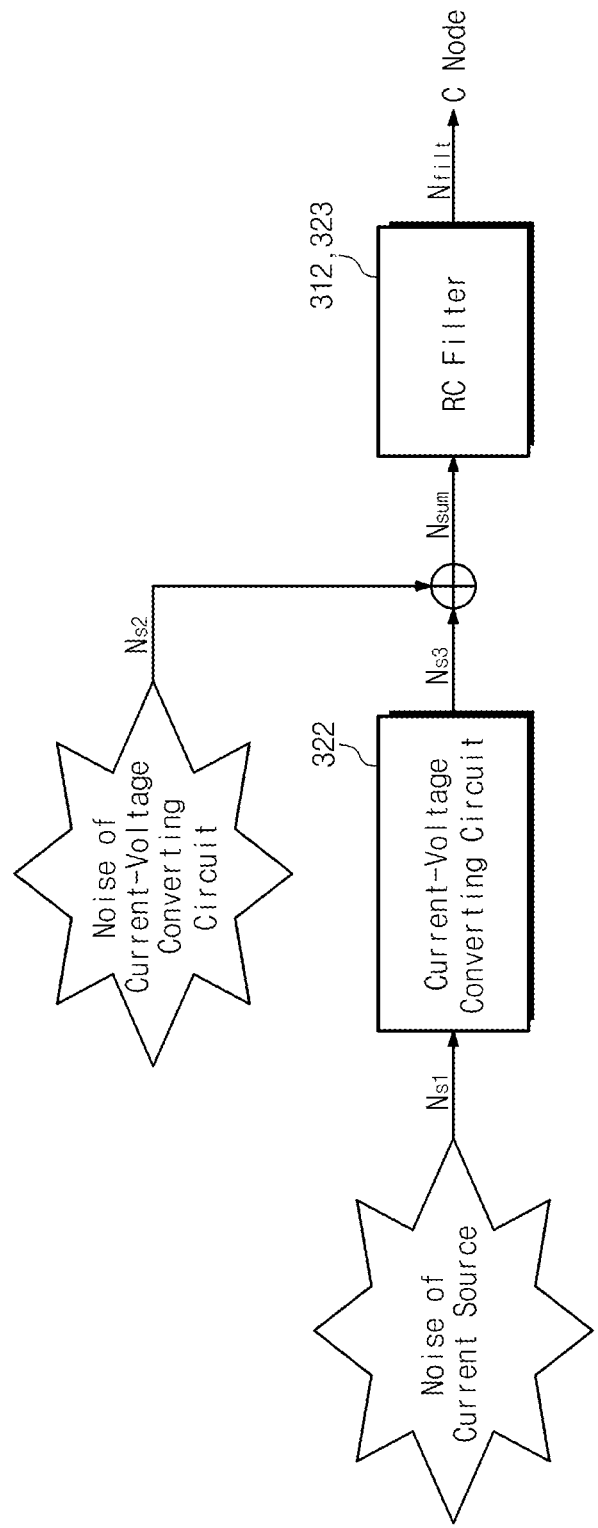
FIG. 15 is a conceptual diagram illustrating a noise removing operation of a bias voltage generating unit in a sound detecting device in FIG. 3.

FIG. 15 is a conceptual diagram illustrating a noise removing operation of a bias voltage generating unit in a sound detecting device in FIG. 3. Below, a noise removing operation of a bias voltage generating unit in FIG. 3 will be more fully described with reference to FIGS. 3 and 15.

As illustrated in FIG. 15, a current source of a bias voltage generating unit 320 in FIG. 3 may generate a current source noise Ns1. Since a current-voltage converting circuit 322 has a low impedance characteristic, the current source noise Ns1 may be reduced by the current-voltage converting circuit 322. The current source noise reduced by the current-voltage converting circuit 322 may be referred to as a reduced current source noise Ns3.

The current-voltage converting circuit 322 can generate a current-voltage converting circuit noise Ns2. The current-voltage converting circuit noise Ns2 and the reduced current source noise Ns3 may be reduced by the RC filter. Herein, the RC filter may be made by capacitance of the resistance circuit 323 and the microphone sensor 312 and parasitic capacitance of the node C. The RC filter formed at the node C may have a pole that is located at a very low frequency below 20 Hz, so that the current-voltage converting circuit noise Ns2 and the reduced current source noise Ns3 are reduced.

Thus, the current source noise Ns1 may be reduced by the current-voltage converting circuit 322 and the RC filter, and the current-voltage converting circuit noise Ns2 may be reduced by the RC filter. That is, a stable bias voltage may be provided to an input stage (i.e., the node C) of the amplification unit 330.

The above description may be exemplary, and the inventive concept may not be limited thereto. For example, interconnections of elements 310, 320, 330, and 340 in FIG. 3 may be changed variously. Below, a sound detecting circuit according to other embodiments of the inventive concept will be described with reference to FIGS. 16 and 17.

Figure 16:
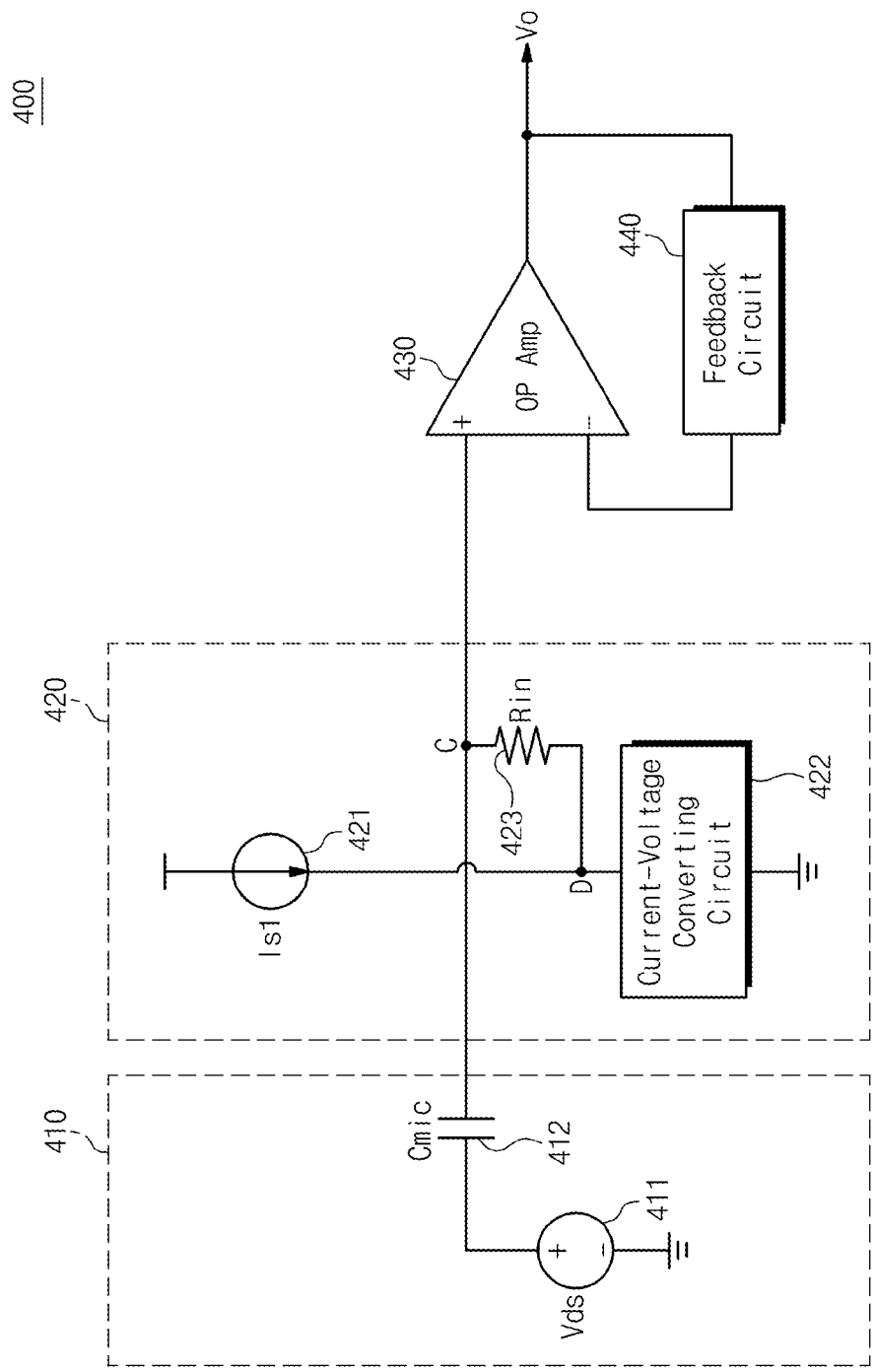
FIG. 16 is a circuit diagram schematically illustrating a sound detecting circuit according to still another embodiment of the inventive concept.

FIG. 16 is a circuit diagram schematically illustrating a sound detecting circuit according to still another embodiment of the inventive concept. A sound detecting circuit 400 in FIG. 16 may perform an amplification operation using an operational amplifier 430 having an inverting input terminal and a non-inverting input terminal.

Referring to FIG. 16, the sound detecting circuit 400 may include a sensing unit 410, a bias voltage generating unit 420, an operational amplifier 430, and a feedback circuit 440. The sensing unit 410 and the bias voltage generating unit 420 may be connected to the non-inverting input terminal of the operational amplifier 430. Like a node C of a sound detecting circuit 300 in FIG. 3, the non-inverting input terminal of the operational amplifier 430 in FIG. 16 may be connected with the bias voltage generating unit 420 that provides large impedance to secure an audio band and provides a stable bias voltage at the same time.

Figure 17:
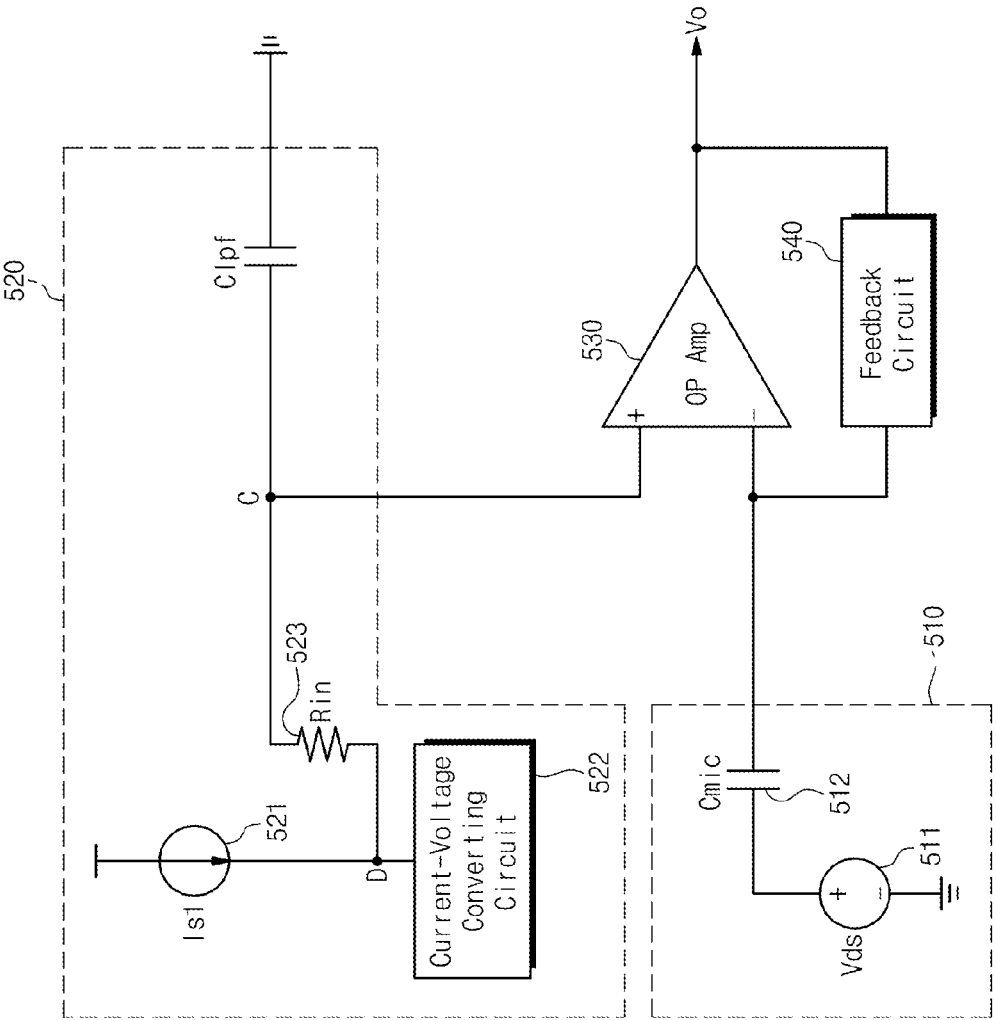
FIG. 17 is a circuit diagram schematically illustrating a sound detecting circuit according to still another embodiment of the inventive concept.

FIG. 17 is a circuit diagram schematically illustrating a sound detecting circuit according to still another embodiment of the inventive concept. Like a sound detecting circuit 400 in FIG. 16, a sound detecting circuit 500 in FIG. 17 may perform an amplification operation using an operational amplifier 530 having an inverting input terminal and a non-inverting input terminal.

Unlike a sound detecting circuit 400 in FIG. 16, a sensing unit 510 of the sound detecting circuit 500 in FIG. 17 may be connected with an inverting input terminal of the operational amplifier 530, and a bias voltage generating unit 520 may be connected with a non-inverting input terminal of the operational amplifier 530. A sound signal detected by the sensing unit 510 may be output as an analog signal Vo through the operational amplifier 530 and a feedback circuit 540. In this case, a bias voltage of the operational amplifier 530 may be decided by a non-inverting input terminal, and a stable bias voltage generated by the bias voltage generating unit 520 may be provided to the non-inverting input terminal of the operational amplifier 530.

The bias voltage generating unit 520 in FIG. 17 may include a capacitor Clpf connected to the non-inverting input terminal of the operational amplifier 530. A resistance circuit 521 and the capacitor Clpf may act as an RC filter.

With the above description, an amplification circuit may include a bias voltage generating unit and an amplification unit. The bias voltage generating unit may provide a stable bias voltage to the amplification unit without a source follower. For this reason, the amplification circuit may be formed in a small size. Also, a resistor and a capacitor-type sensor of the bias voltage generating unit may act as an RC filter to remove a noise of a signal to be provided to the amplification unit.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A sound detecting circuit comprising:
a sensing unit configured to generate an AC signal in response to a sound pressure level of a sound signal;
an amplification unit configured to amplify the AC signal; and
a bias voltage generating unit configured to generate a bias voltage to be provided to the amplification unit,
wherein the bias voltage generating unit comprises:
a current source configured to provide a power current; and
a current-voltage converting circuit configured to convert the power current into the bias voltage and to reduce a noise due to the power current,
wherein the bias voltage generating unit further comprises a resistance circuit that is connected to and disposed between an output terminal of the sensing unit and the current-voltage converting circuit, and
wherein the sensing unit comprises a capacitor-type sensor, and the resistance circuit and the capacitor-type sensor constitute an RC filter.

2. The sound detecting circuit of claim 1, wherein a voltage variation of the current-voltage converting circuit is less in amount than a current variation.

3. The sound detecting circuit of claim 1, wherein the bias voltage is provided as a reference potential of the AC signal.

4. The sound detecting circuit of claim 1, wherein the resistance circuit includes one of back-to-back connected diodes, back-to-back connected PMOS transistors, and back-to-back connected BJT transistors.

5. The sound detecting circuit of claim 1, wherein the amplification circuit comprises a PMOS transistor, and the AC signal and the bias voltage are provided to a gate of the PMOS transistor.

6. The sound detecting circuit of claim 1, wherein the amplification unit comprises an operational amplifier, and the sensing unit and the bias voltage generating unit are connected to a non-inverting input terminal of the operational amplifier.

7. The sound detecting circuit of claim 1, wherein the current-voltage converting circuit includes one of a diode, a diode-connected BJT, and a diode-connected MOS transistor.

8. An amplification circuit comprising:
an amplification unit configured to amplify an AC signal sensed by a capacitor-type sensor in response to a sound pressure level of a sound signal; and
a bias voltage generating unit configured to generate a DC voltage to be provided to the amplification unit,
wherein the bias voltage generating unit comprises:
a current source configured to generate a DC current; and
a current-voltage converting circuit configured to convert the DC current into the DC voltage, the DC voltage being provided as a reference potential of the AC signal,
wherein the bias voltage generating unit comprises a resistance circuit that is connected to and disposed between the current-voltage converting circuit and the capacitor-type sensor, and the capacitor-type sensor and the resistance circuit constitute an RC filter, and
wherein the RC filter removes a noise generated by the current source and a noise generated by the current-voltage converting circuit.

9. The amplification circuit of claim 8, wherein the current-voltage converting circuit removes a noise generated by the current source, and a voltage variation of the current-voltage converting circuit is less in amount than a current variation.

* * * * *